(12) United States Patent
Jang et al.

(10) Patent No.: US 6,519,196 B1
(45) Date of Patent: Feb. 11, 2003

(54) HIGH SENSITIVE DATA SIGNAL AMPLIFYING CIRCUIT

(75) Inventors: Ji-Eun Jang, Kyoungki-do (KR); Jae-Jin Lee, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/722,476

(22) Filed: Nov. 28, 2000

(30) Foreign Application Priority Data

Nov. 30, 1999 (KR) .......................................... 99-53904

(51) Int. Cl.[7] ............................................... G11C 7/00
(52) U.S. Cl. ........................ 365/205; 365/207; 365/208
(58) Field of Search .............................. 365/205, 207, 365/208, 190; 327/51

(56) References Cited

U.S. PATENT DOCUMENTS

| | | | | |
|---|---|---|---|---|
| 4,984,196 A | * | 1/1991 | Tran et al. | 365/207 |
| 5,687,127 A | * | 11/1997 | Takahashi | 365/205 |
| 5,706,236 A | * | 1/1998 | Yamamoto | 365/205 |
| 6,128,236 A | * | 10/2000 | Faue et al. | 365/207 |
| 6,226,207 B1 | * | 5/2001 | Suh | 365/205 |

* cited by examiner

Primary Examiner—Trong Phan
(74) Attorney, Agent, or Firm—Finnegan, Henderson, Farabow, Garrett, & Dunner, L.L.P.

(57) ABSTRACT

A high sensitive data signal amplifying circuit is capable of amplifying data signals having a small differential voltage by amplifying the data signals transferred from bit line amplifying unit in two stages. The high sensitive data signal amplifying circuit includes: a bit line amplifying unit for amplifying data stored at a memory cell and loading the amplified data on one of a bit line and a bit bar line; a column address selecting unit for transferring an output signal of the bit line amplifying unit depending on a column address signal; a first data signal amplifying unit for amplifying a data signal transferred by the column address selecting unit; a second data signal amplifying unit for amplifying an output signal from the first data signal amplifying unit; and a data signal transferring unit for transferring an output signal of the second data signal amplifying unit to output to a buffering unit.

12 Claims, 6 Drawing Sheets

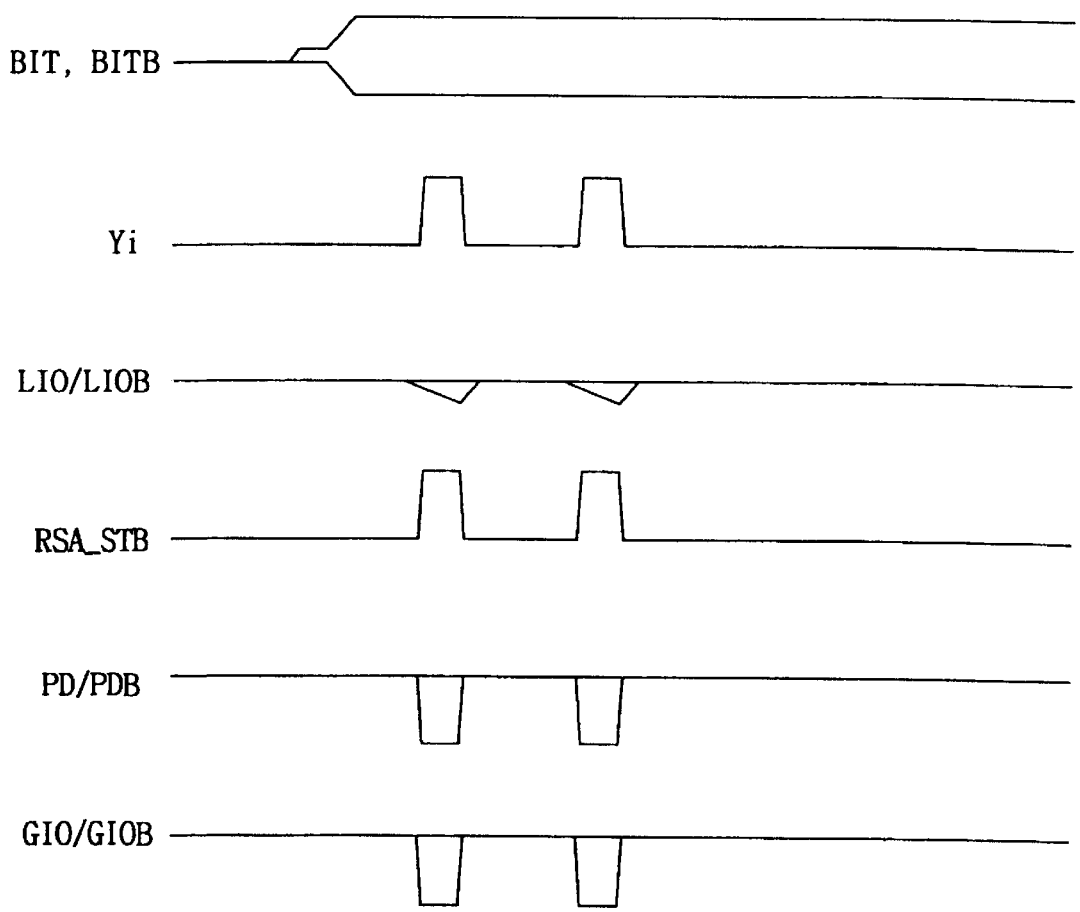

HIGH SENSITIVE DATA SIGNAL AMPLIFYING CIRCUIT

CROSS-REFERENCE TO RELATED APPLICATION

Priority is claimed from Republic of Korean Patent Application No. 99-53904 filed Nov. 30, 1999, which is incorporated in its entirety by reference.

FIELD OF THE INVENTION

The present invention relates to a semiconductor memory device; and, more particularly, to a data signal amplifying circuit capable of amplifying data signals having a small differential voltage by employing two stage amplifying units at data signal outputs.

PRIOR ART OF THE INVENTION

In a semiconductor memory device, a sense amplifier is a major part for outputting data stored at a memory cell, which detects and amplifies data signals.

In the sense amplifier, there are required high sensitivity for detecting and amplifying data signals having a small differential voltage, high speed for transferring the data signals, low power consumption and small area within a semiconductor substrate. Particularly, the sensitivity and the speed of the sense amplifier are most important factors to improve performance of the semiconductor memory device.

The differential voltage applied to the sense amplifier through a bit line and a bit bar line coupled to the memory cell can be expressed as follows:

$$\Delta V = \frac{V_{CC}/2}{1 + C_B/C_C}$$

where $C_B$ is bit line capacitance and $C_C$ is cell capacitance. To increase the input differential voltage, $C_B/C_C$ should be made as small as possible and a power voltage VCC should be as high as possible.

However, as memory capability is increased, the length of the bit line is lengthened so that the bit line capacitance $C_B$ increases. And because the power voltage VCC is reduced as size of a transistor is reduced, the input differential voltage $\Delta V$ decreases.

Accordingly, there is required a high sensitive amplifying circuit capable of detecting and amplifying the decreased input differential voltage.

As the amplifying circuit, a current mirror type sense amplifier or a latch type sense amplifier is frequently used. FIG. 1 shows a conventional data signal amplifying circuit including the latch type sense amplifier.

Referring to FIG. 1, the conventional data signal amplifying circuit comprises a bit line amplifying unit 10 for amplifying data stored at a memory cell and load the amplified data on the bit line/bit bar line BIT/BITB, a column address selecting unit 20 for transferring the bit line/bit bar line BIT/BITB depending on a column address signal Yi, a data signal amplifying unit 30 for amplifying data signals LIO/LIOB transferred from the column address selecting unit 20 and a data signal transferring unit 40 for transferring output signals PD/PDB from the data signal amplifying unit 30 to an output buffer unit 50.

The bit line amplifying unit 10 includes the latch type sense amplifier in which complementary metal oxide semiconductor (CMOS) transistors 11, 12 constructed by PMOS transistors P12, P13 and NMOS N11, N12 are cross-coupled. And the latch type sense amplifier is controlled by a first enable signal RTOEB applied to the controlling PMOS transistor 11 coupled between sources of the PMOS transistors P12, P13 and a power voltage VCC and a second enable signal SE applied to the controlling NMOS transistor N13 coupled between sources of the NMOS transistors N11, N12 and a ground voltage GND.

The latch type sense amplifying unit 10 amplifies and outputs the data stored at the memory cell when the first enable signal RTOEB is logic low and the second enable signal SE is logic high.

The column address selecting unit 20 includes NMOS transistors N21, N22. A gate of the NMOS transistors N21, N22 is connected to the column address signal Yi. And NMOS transistors N21, N22 are coupled to the bit line/bit bar line, respectively, for transferring the bit line/bit bar line signal BIT/BITB. When a column address is selected and the column address signal Yi is applied in logic high, the NMOS transistors N21, N22 are turned on so that the bit line/bit bar line signal BIT/BITB are transferred to the data signal amplifying unit 30.

The data signal amplifying unit 30 includes a latch type sense amplifier 32 for amplifying and outputting the output signals LIO/LIOB transferred from the column address selecting unit 20 and an equalizing unit 31 for controlling the output signals PD/PDB depending on a stand-by signal RSA_STB.

In the latch type sense amplifier 32, sources of PMOS transistors P34, P35 are coupled to the power voltage VCC. And a source of an NMOS transistor N31 is coupled to an NMOS transistor N33 having a gate connected to the output signal LIO of the column address selecting unit 20, and a source of an NMOS transistor N32 is coupled to NMOS transistors N34 having a gate connected to the output signal LIOB of the column address selecting unit 20. And the outputs PD/PDB of the latch type sense amplifier 32 are outputted from the drains of the PMOS transistors p34, p35. The output signals LIO/LIOB of the column address selecting unit 20 are respectively applied to the gates of the NMOS transistors N33, N34. And the sources of the NMOS transistors N33, N34 are coupled to a drain of the NMOS transistor N35. A gate and a source of the NMOS transistor N35 are respectively connected to the stand-by signal RSA_STB and to the ground voltage GND.

The equalizing unit 31 includes PMOS transistors P31, P32 of which sources are coupled to the power voltage VCC and drains are coupled to the output PD/PDB of the latch type sense amplifier 32, respectively, and PMOS transistor P33 coupling the drains of the PMOS transistors P31, P32. To all the gates of the PMOS transistors P31, P32, P33, the stand-by signal RSA_STB is applied.

Therefore, while the stand-by signal RSA_STB is logic low, the PMOS transistors P31, P32, P33 of the equalizing unit 31 are turned on and the NMOS transistor N35 coupled to the ground voltage GND at bottom of the latch type sense amplifier 32 is turned off so that all the output signals PD/PDB of the data signal amplifying unit 30 outputs logic high signal, i.e., no amplifying performed. On the contrary, while the stand-by signal RSA_STB is logic high, the data signal amplifying unit 30 are amplified output signals PD/PDB.

The data signal transferring unit 40 includes inverters NOT41, NOT42 for inverting the output signals PDB/PD of the data signal amplifying unit 30 and NMOS transistors N41, N42 of which gates are connected to the outputs of the inverters NOT41, NOT42, respectively, and sources are coupled to the ground voltage GND. The data signal transferring unit 40 transfers the output signals PDB/PD of the data signal amplifying unit 30 to the output buffer unit 50.

FIG. 2 is a signal waveform diagram showing data signal amplifying procedure performed by the data signal amplifying circuit. Referring to FIG. 2, the conventional data signal amplifying circuit amplifies differential voltage of the data signal LIO/LIOB transferred by the column address selecting unit 20 and transfers it to the output buffer unit 50.

However, as memory devices becomes high integrated and capacitance of the bit lines BIT/BITB are increased, the differential voltage between the data signals applied to the amplifying circuit becomes too small to detect, which leads failure of the data signal amplifying circuit.

SUMMARY OF THE INVENTION

Therefore, it is an object of the present invention to provide a data signal amplifying circuit capable of amplifying data signals having a small differential voltage by amplifying the data signals transferred from bit line amplifying unit in two stages.

In accordance with an aspect of the present invention, there is provided a high sensitive data signal amplifying circuit comprising: a bit line amplifying unit for amplifying data stored at a memory cell and loading the amplified data on one of a bit line and a bit bar line; a column address selecting unit for transferring an output signal of the bit line amplifying unit depending on a column address signal; a first data signal amplifying unit for amplifying a data signal transferred by the column address selecting unit; a second data signal amplifying unit for amplifying an output signal from the first data signal amplifying unit; and a data signal transferring unit for transferring an output signal of the second data signal amplifying unit to output to a buffering unit.

In the high sensitive data signal amplifying circuit, the first data signal amplifying unit includes: a sense amplifying unit for amplifying the output signal of the column address selecting unit by using with a first stand-by signal and an equalizing signal as control signals; a precharging unit for precharging the sense amplifying unit by using the first stand-by signal as a control signal.

In the high sensitive data signal amplifying circuit, the sense amplifying unit includes: a first current mirror type amplifier for amplifying a differential voltage of a first output signal relative to a second output signal of the column address selecting unit; a second current mirror type amplifier for amplifying a differential voltage of a second output signal relative to a first output signal of the column address selecting unit; and a first equalizing unit for controlling output signals of the first and the second current mirror type sense amplifier.

In the high sensitive data signal amplifying circuit, the precharging unit includes: a first precharging unit for precharging the first current mirror type sense amplifier; and a second precharging unit for precharging the second current mirror type sense amplifier.

In the high sensitive data signal amplifying circuit, the first and the second precharging units include a number of PMOS transistors.

In the high sensitive data signal amplifying circuit, the second data signal amplifying unit includes: a latch type sense amplifier for amplifying an output signal of the first data signal amplifying unit by using a second stand-by signal as a control signal; and a second equalizing unit for controlling an output signal depending on the second stand-by signal.

BRIEF DESCRIPTION OF THE DRAWINGS

The above and other objects and features of the instant invention will become apparent from the following description of preferred embodiments taken in conjunction with the accompanying drawings, in which:

FIG. 2 is a signal waveform diagram of the conventional data signal amplifying circuit in FIG. 2;

PREFERRED EMBODIMENT OF THE INVENTION

Hereinafter, preferred embodiments of the present invention will be described in detail with reference to the accompanying drawings.

Figure 3A:
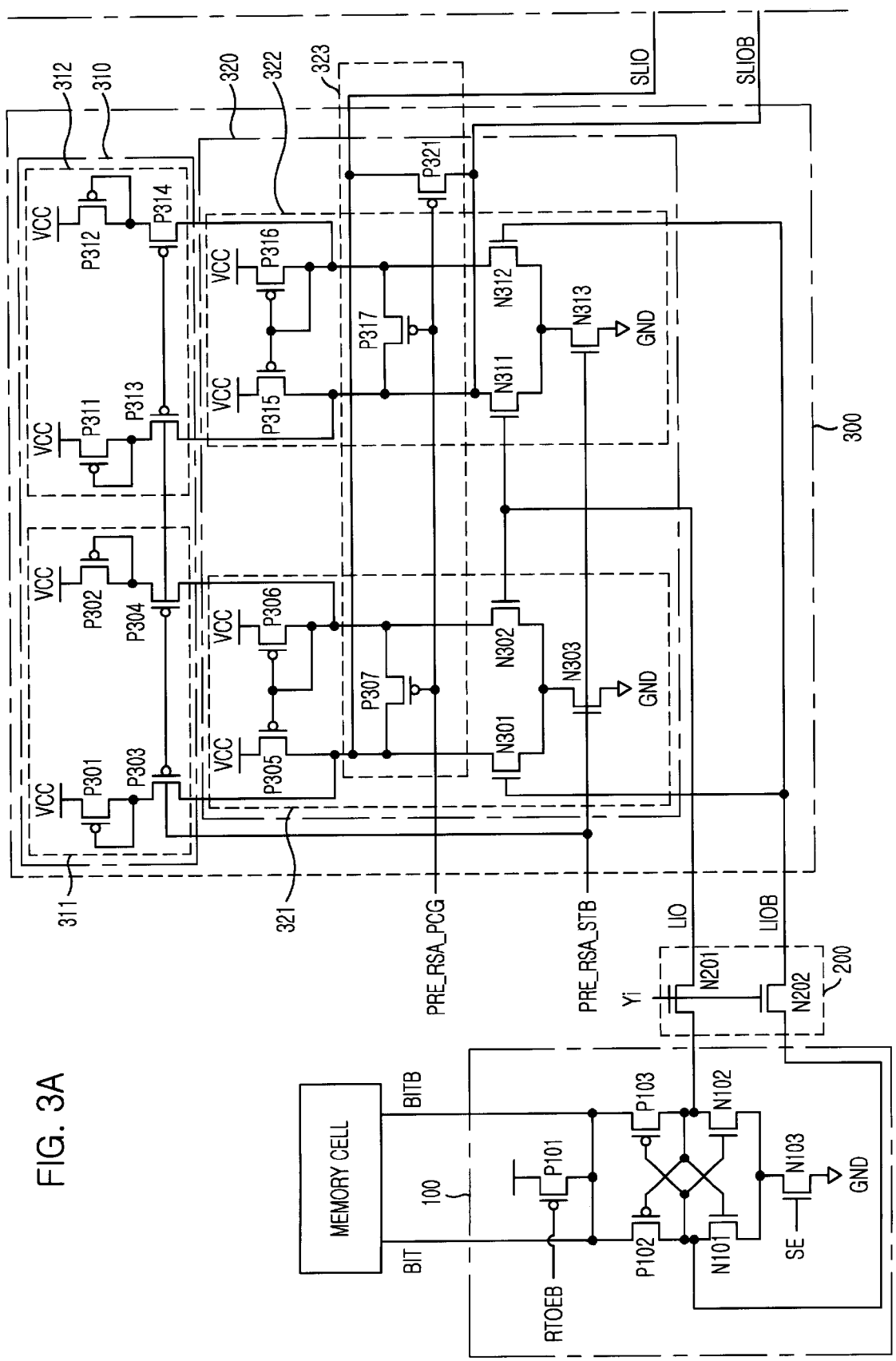
FIGS. 3A and 3B are circuit diagrams for a high sensitive data signal amplifying circuit in accordance with the present invention.
Figure 3B:
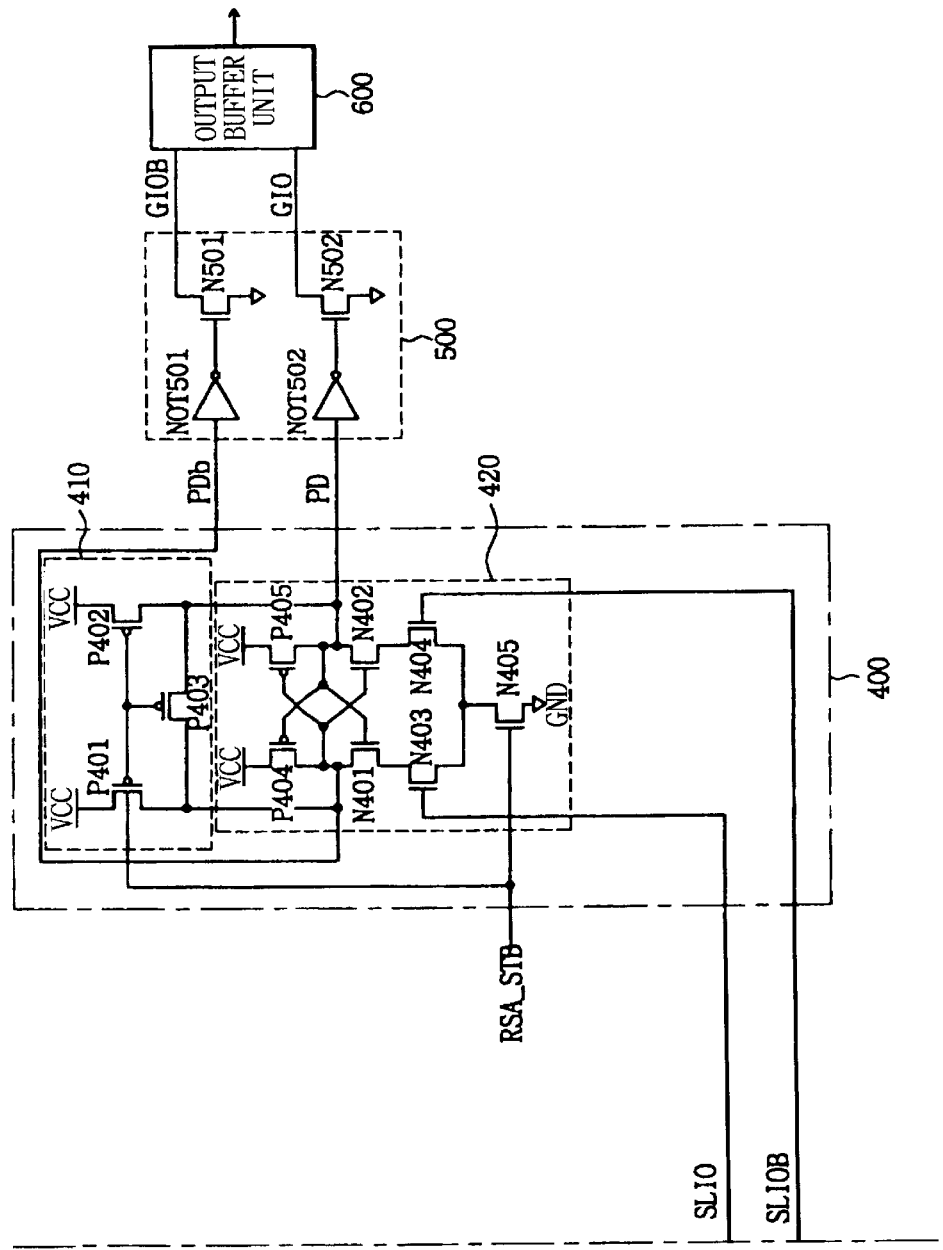

FIGS. 3A and 3B are a circuit diagram for a high sensitive data signal amplifying circuit in accordance with the present invention. Referring to FIGS. 3A and 3B, the data signal amplifying circuit of the present invention comprises a bit line amplifying unit 100 for amplifying data signal stored at a memory cell on load the amplified data to a bit line/a bit bar line, a column address selecting unit 200 for transferring output signals BIT/BITB of the bit line amplifying unit 100 depending on a column address signal, a first data signal amplifying unit 300 for amplifying the data signals LIO/LIOB transferred from the column address selecting unit 200, a second data signal amplifying unit 400 for amplifying the amplified data signal from the first data signal amplifying unit 300, and a data signal transferring unit 500 for transferring the output signal of the second data signal amplifying unit 400 to a buffering unit 600.

Figure 1:
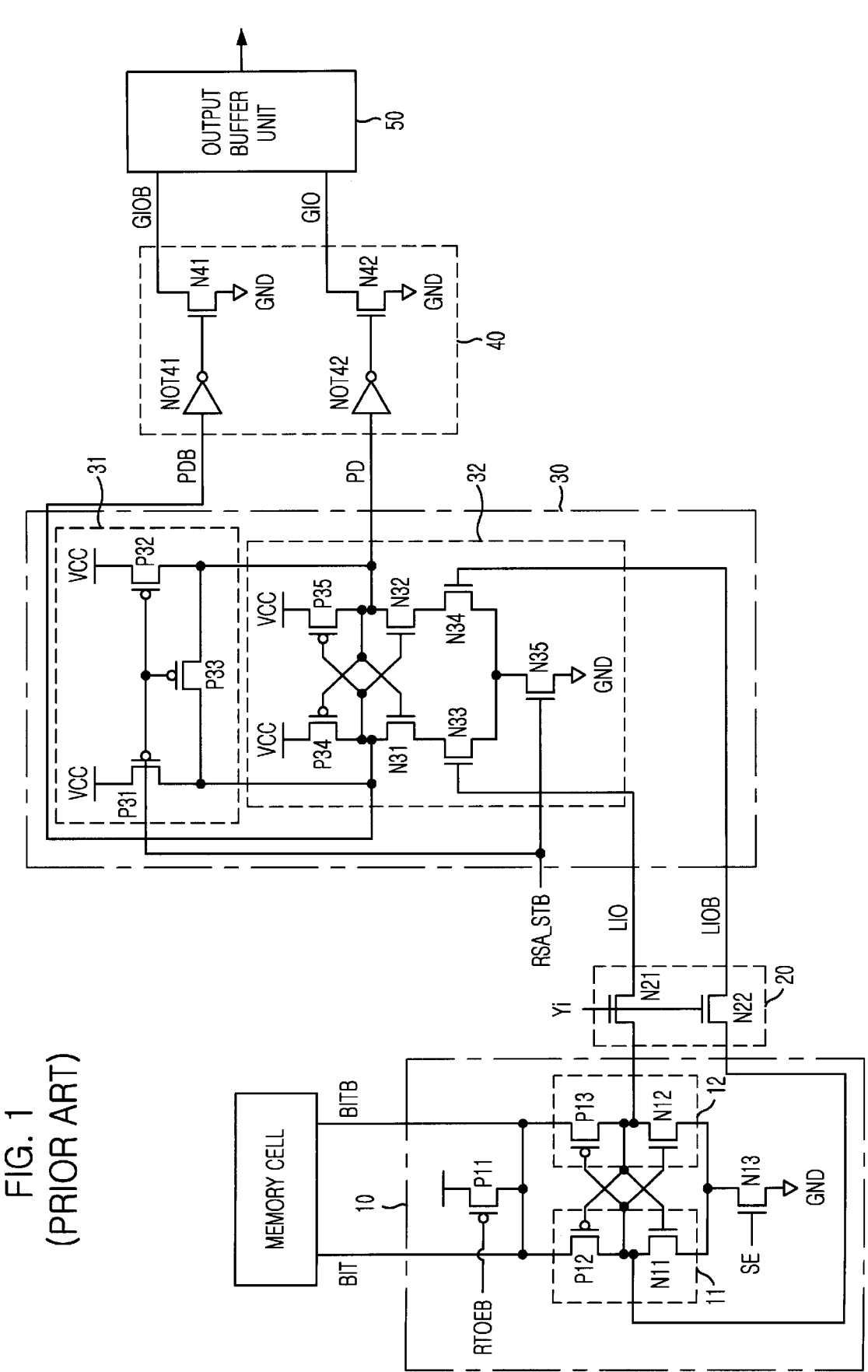
FIG. 1 is a circuit diagram for a conventional data signal amplifying circuit.

The bit line amplifying unit 100 includes a latch type sense amplifier and the column address selecting unit 200 includes NMOS transistors N201, N202 connected to a column address signal Yi. The bit line amplifying unit 100 and the column address selecting unit 200 are respectively similar to the bit line amplifying unit 10 and the column address selecting unit 20 of the conventional data signal amplifying circuit as shown in FIG. 1.

The first data signal amplifying unit 300 includes a sense amplifying unit 320 for detecting and amplifying the differential voltage of output signals of the column address selecting unit 200 and a precharging unit 310 for precharging the sense amplifying unit 320.

The sense amplifying unit 320 includes a first and a second current mirror type sense amplifiers 321, 322 coupled parallel to each other to amplify the output signals LIO/LIOB of the column address selecting unit 200, and an equalizing unit 323 for controlling the current mirror type sense amplifiers 321, 322.

The fist current mirror sense amplifier 321 includes PMOS transistors P305, P306 coupled in current mirror type, NMOS transistors N301, N302, respectively coupled to the PMOS transistors P305, P306 and connected to the output signals LIO, LIOB of the column address selecting unit 200, and an NMOS transistor N303, having a drain coupled to sources of the NMOS transistors N301, N302 and a source coupled a ground voltage GND, for receiving a first stand-by signal PRE_RSA_STB to control amplifying. The first current mirror type sense amplifier 321 generates an output signal SLIO by amplifying the differential voltage of the second output signal LIOB to the first output signal LIO of the column address selecting unit 200.

The second current mirror type sense amplifier 322 is similar to the first current mirror type sense amplifier 321 and generates an output signal SLIOB by amplifying the differential voltage of the second output signal LIOB to the first output signal LIO of the column address selecting unit 200.

The first equalizing unit 323 includes a PMOS transistor P307 for coupling drains of the PMOS transistors P305, P306 constructing the first current mirror type sense amplifier 321, a PMOS transistor P317 for coupling drains of the PMOS transistors P315, P316 constructing the second current mirror type sense amplifier 322, and a PMOS transistor P321 for coupling outputs SLIO, SLIOB of the first and the second current mirror type sense amplifiers 321, 322. Gates of the PMOS transistors P307, P317, P321 are connected to the equalizing signal PRE_RSA_PCG.

Accordingly, the PMOS transistors P307, P317, P321 are turned on while the equalizing signal PRE_RSA_PCG is logic low so that the output signals SLIO, SLIOB of the first and the second current mirror type amplifiers 321, 322 have no differential voltage and amplification is not performed. On the contrary, the PMOS transistors P307, P317, P321 are turned off while the equalizing signal PRE_RSA_PCG is logic high so that the amplified output signals SLIO, SLIOB of the first and the second current mirror type amplifiers 321, 322 are transferred to the second data signal amplifying unit 400.

The precharging unit 310 includes a first precharging unit 311 for precharging the first current mirror type sense amplifier 321 and a second precharging unit 312 for precharging the second current mirror type sense amplifier 322.

The first precharging unit 311 includes PMOS transistors P301, P302, of which sources are coupled to the power voltage and gates and drains are coupled to each other, for acting as a diode, and PMOS transistors P303, P304 connected to the first stand-by signal PRE_RSA_STB for coupling drains of the PMOS transistors P301, P302 and the PMOS transistors P305, P306 of the first current mirror sense amplifier 321.

The second precharging unit 312 is coupled to the second current mirror type sense amplifier 322 and similar to the first precharging unit 311.

Accordingly, the PMOS transistors P303, P304, P313, P314 connected to the first stand-by signal PRE_RSA_STB are turned on when the first stand-by signal PRE_RSA_STB is logic low so that the first and the second precharging units 311, 312 precharge the first and the second current mirror type sense amplifiers 321, 322. On the contrary, the PMOS transistors P303, P304, P313, P314 connected to the first stand-by signal PRE RSA STB are turned off when the first stand-by signal PRE_RSA_STB is logic high, so that the first and the second precharging units 311, 312 do not precharge the first and the second current mirror type sense amplifier 321, 322 but the first and the second current mirror type sense amplifier 321, 322 performs amplification.

The second data signal amplifying unit 400 includes a latch type sense amplifier 420 for amplifying the output signals SLIO/SLIOB of the first data signal amplifying unit 300 with a second stand-by signal RSA_STB as a control signal. And a second equalizing unit 410 for controlling output signals PD/PDB of the latch type sense amplifier 420 depending on the second stand-by signal RSA_STB. The second data signal amplifying unit 400 includes the latch type sense amplifier 420 and the second equalizing unit 410 having a number of PMOS transistors P401, P402, P403 as similarly as the data signal amplifying unit 30 as shown in FIG. 1.

The data signal transferring unit 500 includes inverters NOT501, NOT502 for transferring the output signals PD/PDB of the second data signal amplifying unit 400, and NMOS transistors N501, N502, which is similar to the data signal transferring unit 40 as shown in FIG. 1.

Hereinafter, the operation of the data signal amplifying circuit as described above will be described in detail.

In the bit line amplifying unit 100, the latch type sense amplifier performs amplification when a first enable signal RTOEB is logic low and a second enable signal SE is high so that data signal stored at a memory cell is loaded on the bit line.

Then, a column selected by the column address selecting unit 200 transfers the output signals BIT/BITB of the bit line amplifying unit 100 to the first data signal amplifying unit 300.

The transferred data signals LIO/LIOB are at first amplified by the first data signal amplifying unit 300 including the first and the second current mirror sense amplifying unit 321, 322 and then once again amplified by the second data signal amplifying unit 400 having the latch type sense amplifier 420 to output the output signals PD/PDB Before the first data signal amplifying unit 300 performs amplification, while the first stand-by signal PRE_RSA_STB is logic low, the precharging unit 310 precharges the first and the second current mirror type sense amplifiers 321, 322 to a voltage VCC−Vt, Vt being a threshold voltage of the diode which is constructed by the PMOS transistors P301, P302, P311, P312.

Therefore, the first and the second current mirror type sense amplifiers 321, 322 precharged are enabled to amplify the first and the second output signals LIO/LIOB of the column address selecting unit 200 with high speed. The first and the second current mirror type sense amplifiers 321, 322 amplify the differential voltage of the first output signal LIO to the second output signal LIOB and the differential voltage of the second output signal LIOB to the first output signal LIO, respectively.

And when the equalizing signal PRE_RSA_PCG is logic low and the PMOS transistors P307, P317, P321 of the first equalizing unit 323 is turned on, the outputs SLIO/SLIOB of the first and the second current mirror type sense amplifiers 321, 322 have no differential voltage so that no amplified signal is outputted. On the contrary, when the equalizing signal PRE_RSA_PCG is logic high and the PMOS transistors P307, P317, P321 of the first equalizing unit 323 are turned off, the amplified signal is outputted normally.

The first data signal amplifying unit 300 can be operated in two ways.

First, the first data signal amplifying unit 300 is enabled at an initial amplifying operation and disabled after a final amplifying operation. In this way, after the first stand-by signal PRE_RSA_STB is applied in high at the initial amplifying operation, it is remained in high till the final amplifying operation and is transited to low after the final amplifying operation, and the equalizing signal PRE_RSA_PCG is applied at every clock at which the data signals LIO/LIOB are applied.

Second, the first stand_by signal PRE_RSA_STB and equalizing signal PRE_RSA_PCG are applied at every clock at which the data signals LIO/LIOB are applied. In this way, the two signals PRE_RSA_STB, PRE_RSA_PCG are applied as tied.

The amplified signals SLIO/SLIOB from the first data signal amplifying unit 300 are once again amplified at the second signal amplifying unit 400. When the second stand-by signal RSA_STB is high and the PMOS transistors P401, P402, P403 are turned off, the normal amplified signals PD/PDB are outputted.

The output signals PD/PDB from the second data signal amplifying unit 400 is transferred to the buffer unit 600 through the data signal transferring unit 500 including the inverters NOT501, NOT502 and the NMOS transistors N501, N502.

Figure 4A:
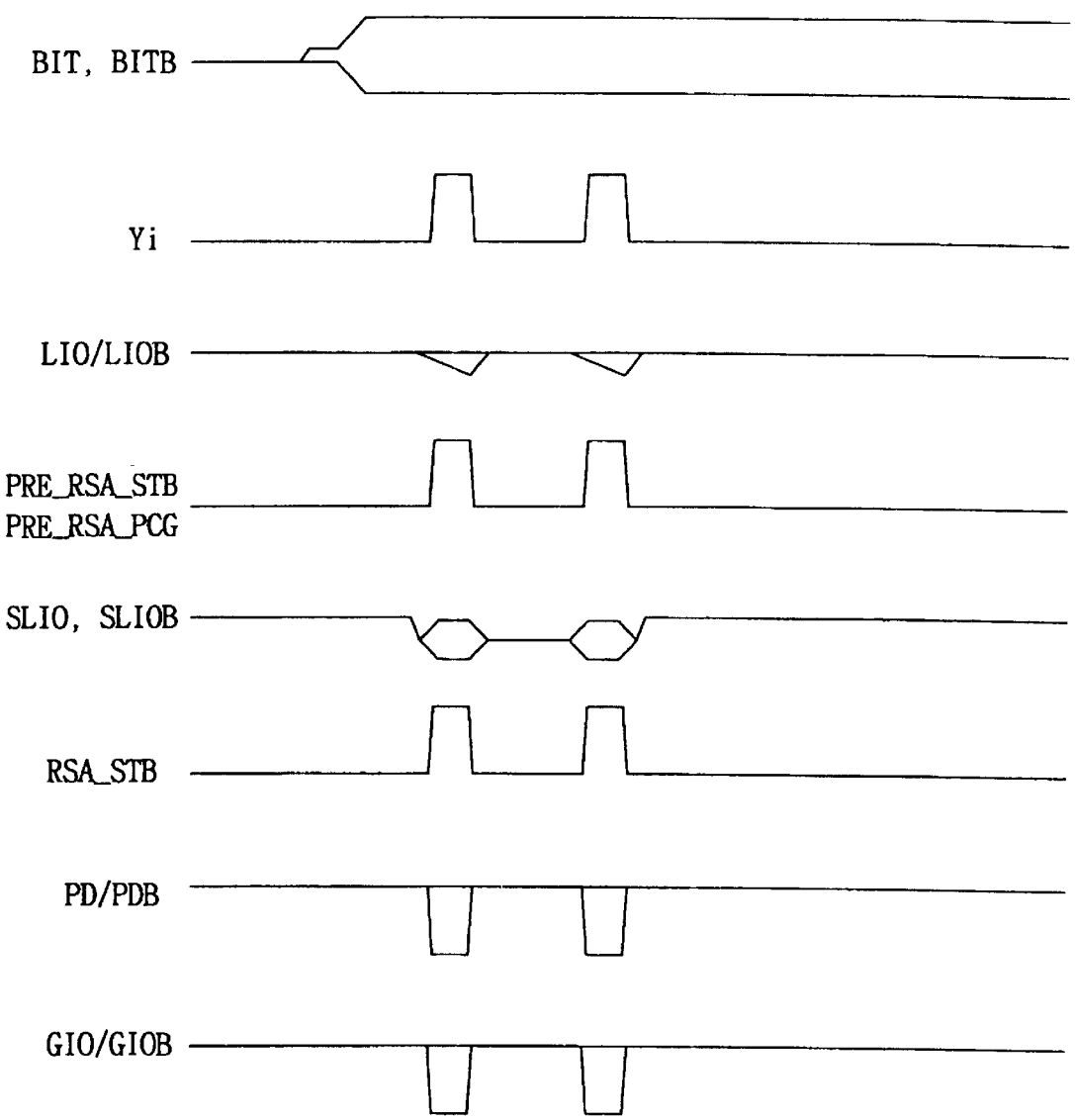
FIGS. 4A and 4B are signal waveform diagrams of the high sensitive data signal amplifying circuit in accordance with the present invention.
Figure 4B:
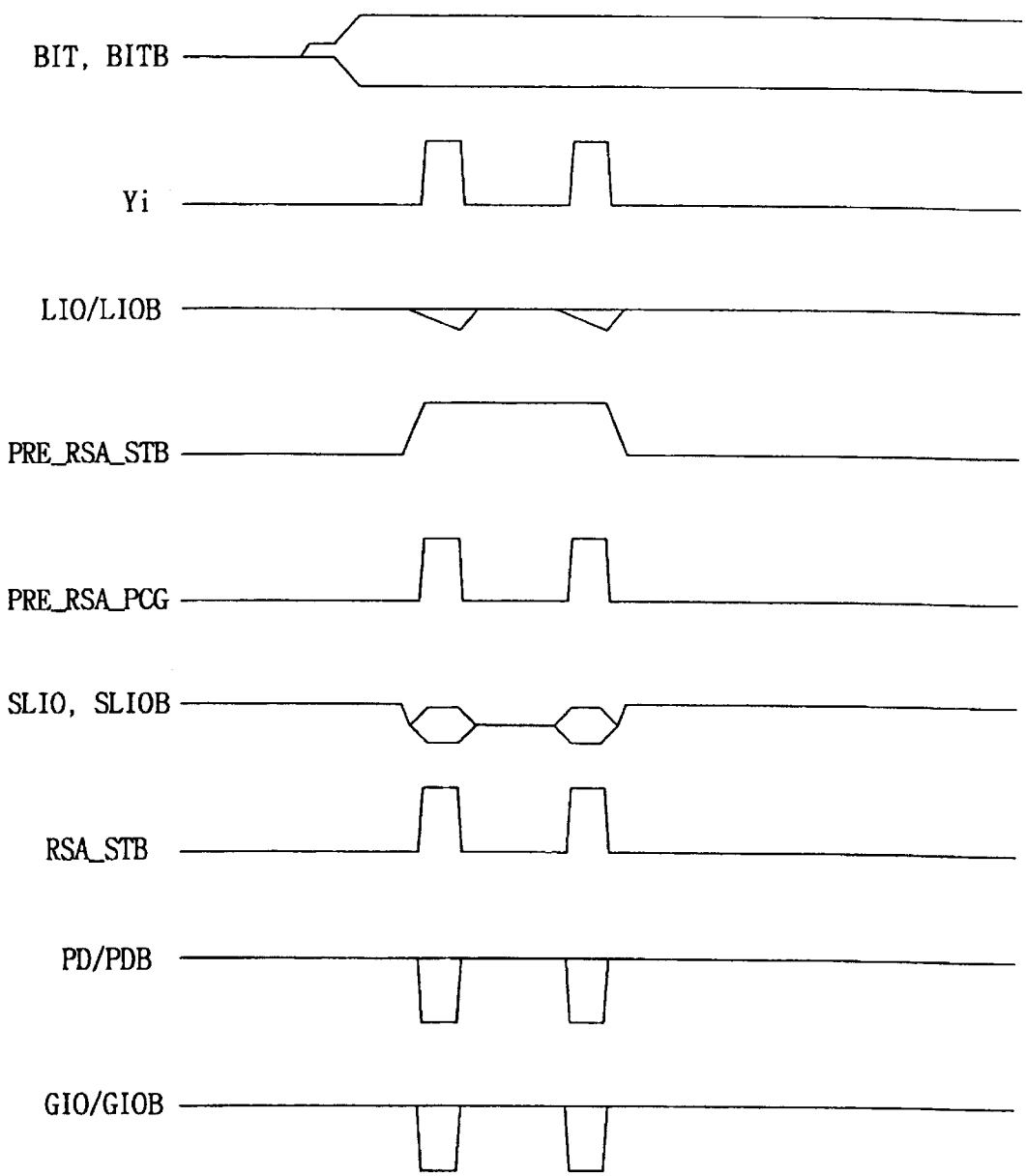

FIGS. 4A and 4B are signal waveform diagrams of the high sensitive data signal amplifying circuit in accordance with the present invention. FIG. 4A shows the case in which the first stand-by signal PRE_RSA_STB and the equalizing signal PRE_RSA_PCG are equally applied to the first data signal amplifying unit 400 at every clock. And FIG. 4B shows the case in which the first stand-by signal PRE_RSA_STB is remained in high and the equalizing signal PRE_RSA_PCG is applied at every clock while the first and the second data signal amplifying units 300, 400 perform the amplification.

As described above, by amplifying two times the bit line data signals BIT/BITB, abnormal operation of the data signal output operation can be prevented.

In accordance with the present invention, by outputting the data signal amplified by the first and the second data signal amplifying units, the abnormal operation due to missing the data signal of which differential voltage is too small to detect and stable operation of the semiconductor device can be implemented.

And by precharging the sense amplifiers by including the precharging unit in the first data signal amplifying unit, high speed amplification can be performed.

While the present invention has been shown and described with respect to the particular embodiments, it will be apparent to those skilled in the art that many changes and modifications may be made without departing from the spirit and scope of the invention as defined in the appended claims.

What is claimed is:

1. A high sensitive data signal amplifying circuit comprising:
   bit line amplifying means for amplifying data stored at a memory cell and loading the amplified data on one of a bit line and a bit bar line;
   column address selecting means for transferring an output signal of the bit line amplifying means depending on a column address signal;
   first data signal amplifying means for amplifying a data signal transferred by the column address selecting means, wherein the first data signal amplifying means comprises:
   sense amplifying means for amplifying the output signal of the column address selecting means by using a first stand-by signal and an equalizing signal as control signals; and
   precharging means for precharging the sense amplifying means by using the first stand-by signal as a control signal;
   second data signal amplifying means for amplifying an output signal from the first data signal amplifying means; and
   data signal transferring means for transferring an output signal of the second data signal amplifying means to output to buffering means.

2. The high sensitive data signal amplifying circuit according to claim 1, wherein the bit line amplifying means comprises a latch type sense amplifier comprising cross-coupled CMOS transistors, each said CMOS transistor comprising a PMOS transistor and an NMOS transistor.

3. The high sensitive data signal amplifying circuit according to claim 1, wherein the sense amplifying means comprises:
   a first current mirror type sense amplifier for amplifying differential voltage of a first output signal relative to a second output signal of the column address selecting means;
   a second current mirror type sense amplifier for amplifying differential voltage of the second output signal relative to the first output signal of the column address selecting means; and
   first equalizing means for controlling output signals of the first and the second current mirror type sense amplifiers.

4. The high sensitive data signal amplifying circuit according to claim 3, wherein the first current mirror sense amplifier comprises:
   first and second PMOS transistors comprising sources coupled to a power voltage and aligned in current mirror type;
   a first NMOS transistor comprising a gate connected to the second output signal of the column address selecting means and a drain coupled to a drain of the first PMOS transistor;
   a second NMOS transistor comprising a gate connected to the first output signal of the column address selecting means and a drain coupled to a drain of the second PMOS transistor; and
   a third NMOS transistor comprising a drain coupled to the sources of the first and the second NMOS transistors and a gate connected to the first stand-by signal,
   wherein the output signal is outputted from the drain of first PMOS transistor.

5. The high sensitive data signal amplifying circuit according to claim 3, wherein the second current mirror sense amplifier comprises:
   first and second PMOS transistors comprising sources coupled to a power voltage and having a mirror type alignment;
   a first NMOS transistor comprising a gate connected to the first output signal of the column address selecting means and a drain coupled to a drain of the first PMOS transistor;
   a second NMOS transistor comprising a gate connected to the second output signal of the column address selecting means and a drain coupled to a drain of the second PMOS transistor; and
   a third NMOS transistor comprising a drain coupled to the sources of the first and the second NMOS transistors and a gate connected to the first stand-by signal,
   wherein the output signal is outputted from the drain of first PMOS transistor.

6. The high sensitive data signal amplifying circuit according to claim 3, wherein the first equalizing means comprises:

a third PMOS transistor, comprising a gate connected to the equalizing signal, for coupling the drains of the first and the second PMOS transistors of the first current mirror type sense amplifier;

a fourth PMOS transistor, comprising a gate connected to the equalizing signal, for coupling the drains of the first and the second PMOS transistors of the second current mirror type sense amplifier; and a fifth PMOS transistor, comprising a gate connected to the equalizing signal, for coupling the output signals of the first and the second current mirror type sense amplifiers.

7. The high sensitive data signal amplifying circuit according to claim 1, wherein the precharging means comprises:

a first precharging means for precharging the first current mirror type sense amplifier; and a second precharging means for precharging the second current mirror type sense amplifier.

8. The high sensitive data signal amplifying circuit according to claim 7, wherein the first precharging means comprises:

third and fourth PMOS transistors, each said third and fourth PMOS transistors comprising a source coupled to the power voltage, wherein respective gates and drains of the third and the fourth transistors are coupled to each other;

a fifth PMOS transistor for coupling the drains of the third PMOS transistor and the first PMOS transistor of the first current mirror type sense amplifier, comprising a gate connected to the first stand-by signal; and a sixth PMOS transistor for coupling the drains of the fourth PMOS transistor and the second PMOS transistor of the first current mirror type sense amplifier, comprising a gate connected to the first stand-by signal.

9. The high sensitive data signal amplifying circuit according to claim 7, wherein the second precharging means comprises:

third and fourth PMOS transistors, each said third and fourth PMOS transistors comprising a source coupled to the power voltage, wherein gates and sources of the third and the fourth transistors are coupled to each other;

a fifth EIMOS transistor, comprising a gate connected to the first stand-by signal, for coupling the drains of the third PMOS transistor and the first PMOS transistor of the second current mirror type sense amplifier; and a sixth PMOS transistor, comprising a gate connected to the first stand-by signal, for coupling the drains of the fourth PMOS transistor and the second PMOS transistor of the second current mirror type sense amplifier.

10. The high sensitive data signal amplifying circuit according to claim 1, wherein the second data signal amplifying means comprises:

a latch type sense amplifier for amplifying an output signal of the first data signal amplifying means by using a second stand-by signal as a control signal; and second equalizing means for controlling an output signal depending on the second stand-by signal.

11. The high sensitive data signal amplifying circuit according to claim 10, wherein the second equalizing means comprises:

first and second PMOS transistors, each said first and second PMOS transistors comprising a gate connected to the second stand-by signal, a source coupled to the power voltage and a drain coupled to the output of the latch type sense amplifier; and a third PMOS transistor, comprising a gate connected to the second stand-by signal, for coupling the drains of the first and the second PMOS transistors.

12. The high sensitive data signal amplifying circuit according to claim 1, wherein the data signal transferring means comprises:

first and second inverters for inverting the first and second output signals of the second signal amplifying means;

a first NMOS transistor comprising a gate connected to an output signal of the first inverter, a source coupled to a ground voltage and a drain outputting an output signal to the buffering means; and a second NMOS transistor comprising a gate connected to an output signal of the second inverter, a source coupled to a ground voltage and a drain outputting an output signal to the buffering means.

* * * * *